United States Patent
Itoh et al.

(10) Patent No.: US 8,744,810 B2
(45) Date of Patent: Jun. 3, 2014

(54) BONDING MODEL GENERATION APPARATUS AND BONDING MODEL GENERATION METHOD

(75) Inventors: Nobutaka Itoh, Kawasaki (JP); Makoto Sakairi, Kawasaki (JP); Mami Nakadate, Kawasaki (JP); Yoshiteru Ochi, Kawasaki (JP); Akiyoshi Saitou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 415 days.

(21) Appl. No.: 13/024,307

(22) Filed: Feb. 9, 2011

(65) Prior Publication Data

US 2011/0208485 A1 Aug. 25, 2011

(30) Foreign Application Priority Data

Feb. 22, 2010 (JP) ................................. 2010-036682

(51) Int. Cl.
  *G06F 17/50* (2006.01)
(52) U.S. Cl.
  CPC ............ *G06F 17/5068* (2013.01); *G06F 17/50* (2013.01)
  USPC .................................. 703/1; 700/97; 700/98
(58) Field of Classification Search
  CPC .............................. G06F 17/50; G06F 17/5068
  USPC .................... 703/1; 700/97–98; 345/419–420
  See application file for complete search history.

(56) References Cited

U.S. PATENT DOCUMENTS

| 7,149,677 B2 * | 12/2006 | Jayaram et al. ................. 703/22 |
| 7,483,818 B2 * | 1/2009 | Amakai et al. ..................... 703/1 |
| 2001/0033281 A1 * | 10/2001 | Yoshida et al. ............... 345/420 |
| 2008/0140357 A1 * | 6/2008 | Bussey et al. ..................... 703/1 |
| 2009/0174709 A1 * | 7/2009 | Kozlak et al. ................. 345/420 |

FOREIGN PATENT DOCUMENTS

JP  2009-3529 A  1/2009

* cited by examiner

*Primary Examiner* — Eunhee Kim
(74) *Attorney, Agent, or Firm* — Fujitsu Patent Center

(57) ABSTRACT

A bonding surface extraction unit extracts, with reference to bonding information, data of a first bonding surface corresponding to a bottom surface of a bonding model from data of a first partial model and data of a second bonding surface corresponding to a top surface of the bonding model from data of a second partial model. The first partial model is a model of a pad included in a circuit board. The second partial model is a model of an electrode included in a component. The electrode is to be bonded to the pad with a bonding material. A bonding model generation unit generates a side surface establishing a link between outlines of the first bonding surface and the second bonding surface, and obtains data of the bonding model on the basis of a shape formed with the side surface, the first bonding surface, and the second bonding surface.

11 Claims, 12 Drawing Sheets

| BOARD PARTIAL MODEL ID ⌐2010 | CLASS ⌐2020 | LAYER ⌐2030 | ATTRIBUTE DATA ADDRESS ⌐2040 | SHAPE DATA ⌐2050 |
|---|---|---|---|---|
| 001 | PAD | 1 | #128E | xxx,xxx... |
| 002 | WIRE | 1 | — | xxx,xxx... |
| ... | ... | ... | ... | ... |

FIG. 2A (#128E)

| COMPONENT ID ⌐2110 | PIN No. ⌐2120 | BONDING MATERIAL VOLUME ⌐2130 |
|---|---|---|
| cmp01 | 1 | |
| cmp01 | 2 | |
| ... | ... | |

| COMPONENT PARTIAL MODEL ID (2210) | COMPONENT NAME (2220) | PIN (2230) | LOCATION (2240) | ANGLE (2250) | LAYER (2260) | BONDING TYPE (2270) | SHAPE MODEL ID (2280) |
|---|---|---|---|---|---|---|---|
| cmp01 | IC01 | 1,2,... | xx,yy,zz | 1 | 1 | 1 | bm01 |
| cmp02 | C1 | 1,2 | xx,yy,zz | 1 | 1 | 2 | bm13 |
| ... | ... | ... | ... | ... | ... | ... | ... |

FIG. 2D

| SHAPE MODEL ID (2310) | PARTIAL MODEL1 | | | | PARTIAL MODEL2 | | | | |
|---|---|---|---|---|---|---|---|---|---|
| | ID (2321) | CLASS (2322) | RELATIVE LOCATION (2323) | SHAPE DATA (2324) | ID | CLASS | RELATIVE LOCATION | SHAPE DATA | |
| bm01 | Bm01-1 | body | xx,yy,zz | XXX,XXX.. | Bm01-2 | pin1 | xx,yy,zz | XXX,XXX.. | ... |
| bm02 | Bm02-1 | body | xx,yy,zz | XXX,XXX.. | ... | ... | ... | ... | ... |
| ... | ... | ... | ... | ... | ... | ... | ... | ... | ... |

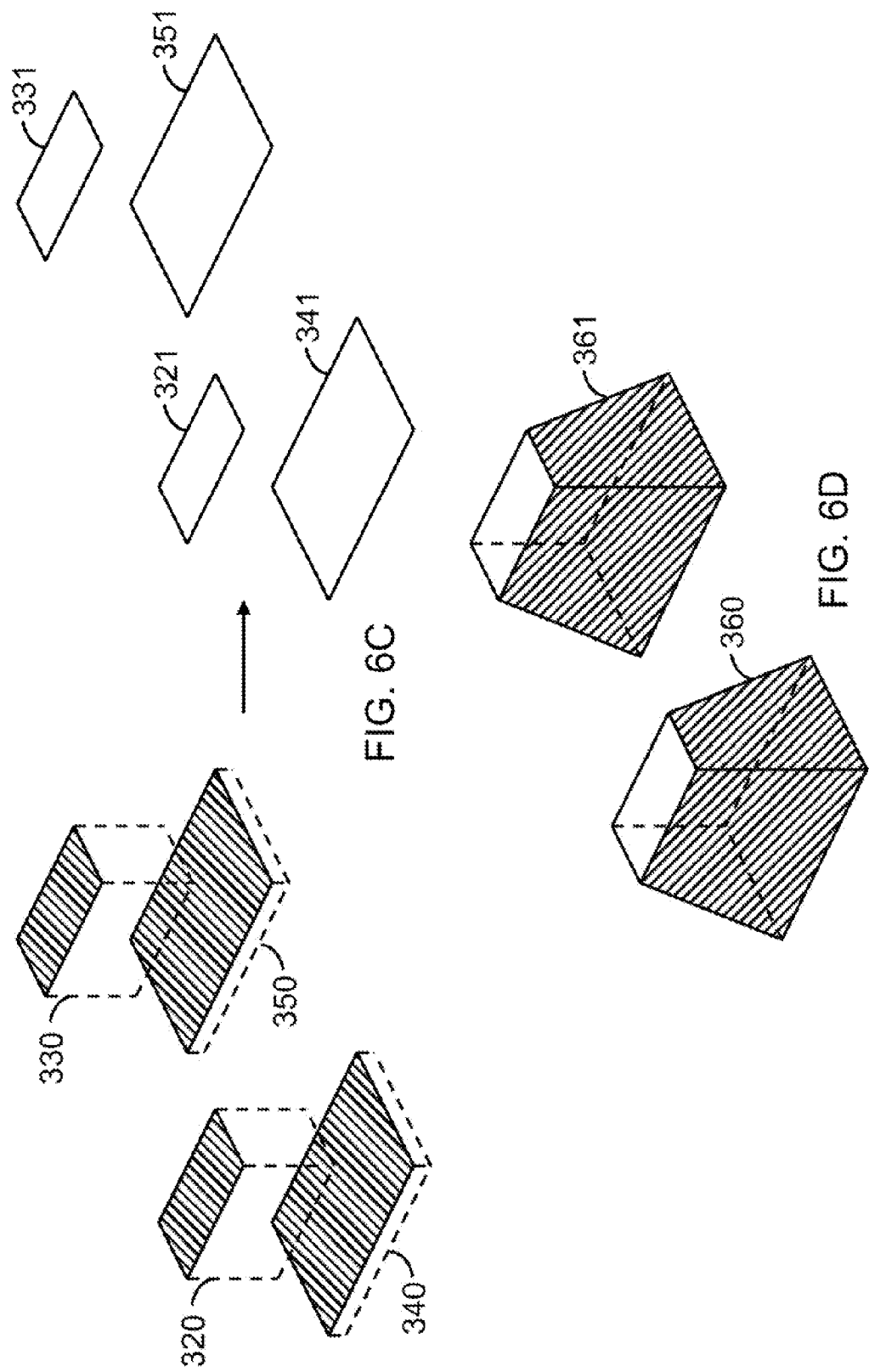

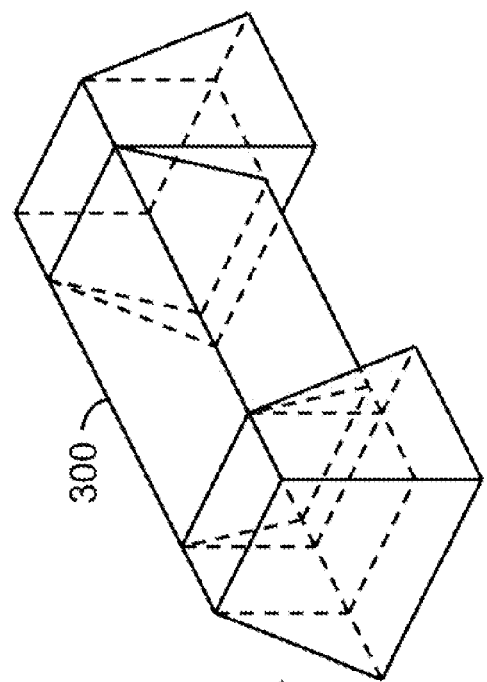
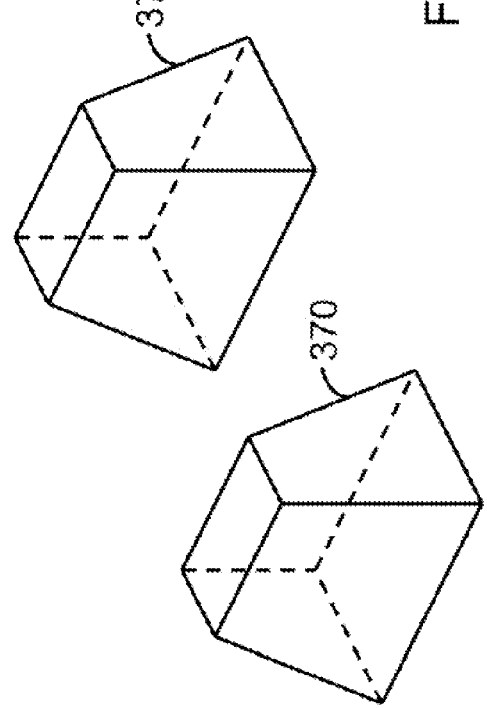
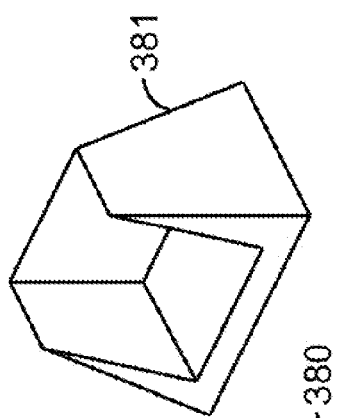
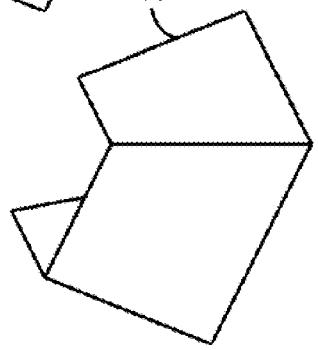
FIG. 6E
FIG. 6F

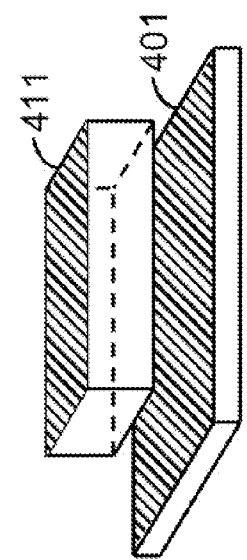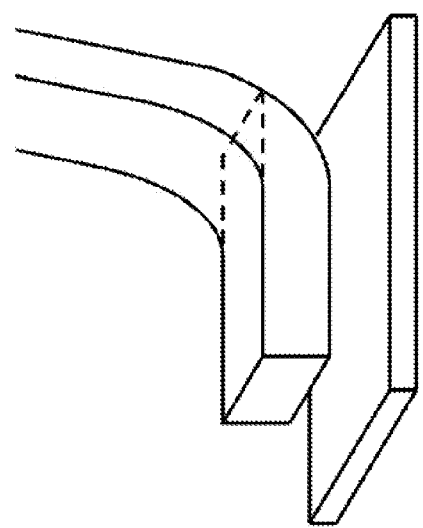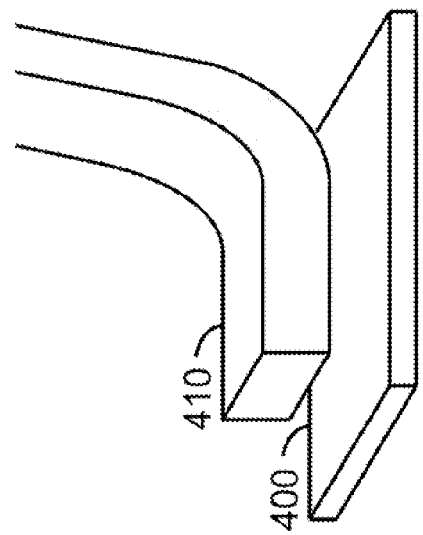

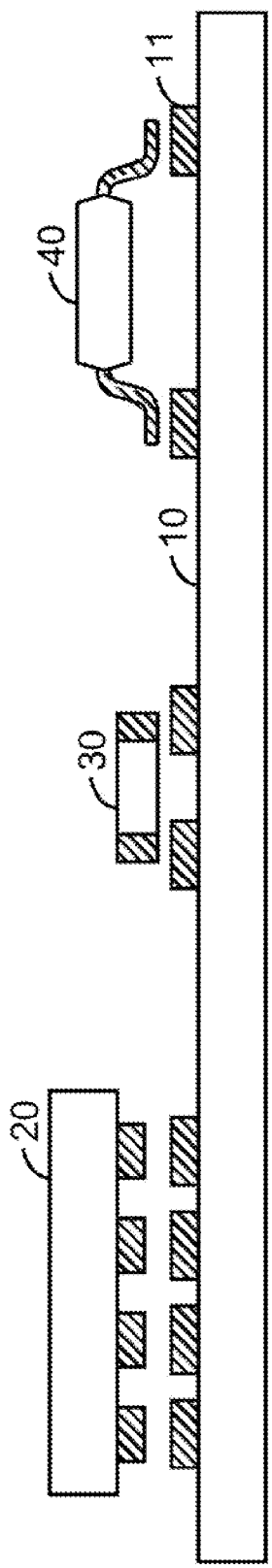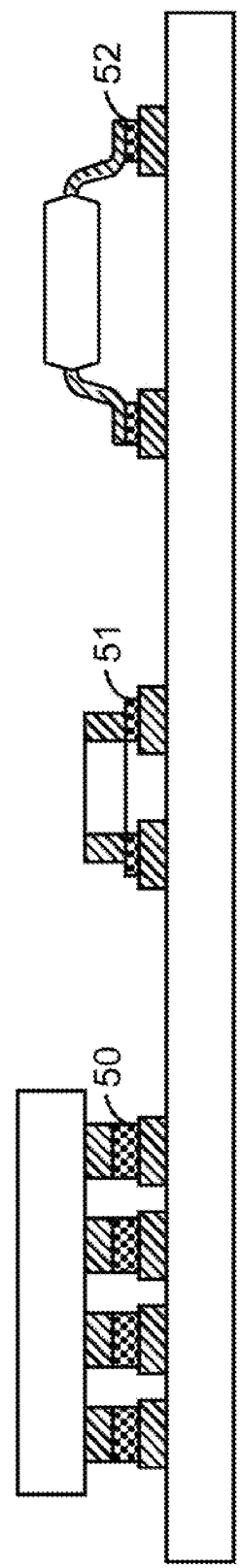

BONDING MODEL GENERATION APPARATUS AND BONDING MODEL GENERATION METHOD

CROSS-REFERENCE TO RELATED APPLICATION

This application is based upon and claims the benefit of priority of the prior Japanese Patent Application No. 2010-036682, filed on Feb. 22, 2010, the entire contents of which are incorporated herein by reference.

FIELD

The embodiments discussed herein are related to a technology of automatically generating a model of the bonding part of a component mounted on a circuit board.

BACKGROUND

Usually, the design of a circuit board has been performed with computer aided design (CAD). With the above-mentioned design which is referred to as the packaging design CAD (or the layout CAD), a computer arranges wiring with interactive processing and/or automatic processing on the basis of circuit-connection information (a net list) or information about a component to be mounted on the circuit board to obtain a desired circuit function.

After finishing the packaging design, the circuit board is generated on the basis of CAD data. Before generating the circuit board, the CAD data is often subjected to a structural analysis simulator to confirm the mechanical strength of the circuit board. For example, it is confirmed, on the basis of the analysis result, whether the strength of the bonding part of the mounted component is impervious to a stress applied to the circuit board when the circuit board is handled and provided in a cabinet.

In the field of the above-mentioned structural analysis, an analysis method based on the finite element method has been available. According to the above-mentioned method, a three-dimensional model to be analyzed is mesh-divided, that is, divided into a set of elements with small regions, and the entire behavior is predicted on the basis of the behavior of each of the elements with the small regions. Therefore, in general, two-dimensional CAD data of the circuit board, which is generated with the packaging design CAD, is converted into three-dimensional model data (hereinafter, the model data is often referred to as a model), and the three-dimensional model data is subjected to the structural analysis simulator. At that time, it is assumed that no bonding material such as solder is used for the part where a pad of the circuit board is bonded to an electrode of the mounted component, that is, the bonding material is ignored. Otherwise, a circular cylinder or a prism is generated as a simple bonding model and added to the three-dimensional model of the circuit board. Then, the three-dimensional model is subjected to the structural analysis simulator. FIG. 8A illustrates a three-dimensional model of a finished circuit board having components that are mounted on the circuit board on the basis of two-dimensional CAD data of the circuit board. Pads 11 to be bonded to mounted components are provided on a circuit board 10, and a ball grid array (BGA) type component 20, a chip type component 30, and a quad flat package (QFP) type component 40 are arranged over the pads 11 as the mounted components. The two-dimensional CAD data does not include data related to the shape of a bonding material such as solder used to bond the pad 11 to the mounted components. Therefore, the mounted components are arranged and floated above the pad 11 by as much as a specified amount determined to be the thickness of the bonding material. FIG. 8B illustrates a case where simple bonding models 50, 51, and 52 are added to the three-dimensional model illustrated in FIG. 8A. The simple bonding model denotes a bonding model including a bonding material such as solder having the shape of a circular cylinder or a prism. Traditionally, the above-mentioned simple bonding model has been used to perform a structural analysis. FIG. 8C illustrates a case where the bonding model is omitted and the mounted components are directly bonded to the pads 11. Traditionally, a mechanical simulation has been performed on the three-dimensional model illustrated in FIG. 8B or FIG. 8C.

FIG. 8D illustrates examples of actual shapes of bonding parts 60, 61, and 62 where the pads are bonded to the mounted components. That is, the actual shape of the bonding part is significantly different from that of the simple bonding model.

In a related matter, the following technology of generating an analysis model of a bonding part has been available. When first and second structural members are bonded to each other with a bonding member which is a third structural member having small thickness, a first and second bonding points are provided on the first and second structural members, respectively, where the first and second structural members are bonded to the third structural member at the first and second bonding points, respectively, and the first and second bonding points are restricted in accordance with a relation achieved on the basis of the physical property of the third structural member. Japanese Laid-open Patent Publication No. 2009-3529 discloses a related technology.

SUMMARY

According to an aspect of the present invention, provided is a bonding model generation apparatus. A bonding model generation apparatus includes a board model storage unit, a partial model extraction unit, a bonding surface extraction unit, and a bonding model generation unit.

The board model storage unit stores data of a board model of an assembled board. The assembled board includes a circuit board and a component to be mounted on the circuit board. The data of the board model includes data of a partial model and bonding information. The partial model is a model of a part of the circuit board or a model of a part of the component. The bonding information indicates one of plural bonding types of bonding between the circuit board and the component.

The partial model extraction unit extracts data of a first partial model and data of a second partial model from the data of the board model. The first partial model is a model of a pad included in the circuit board. The second partial model is a model of an electrode included in the component. The electrode is to be bonded to the pad with a bonding material.

The bonding surface extraction unit extracts, with reference to the bonding information, data of a first bonding surface corresponding to a bottom surface of a bonding model from the data of the first partial model and data of a second bonding surface corresponding to a top surface of the bonding model from the data of the second partial model.

The bonding model generation unit generates a side surface establishing a link between outlines of the first bonding surface and the second bonding surface, and obtains data of the bonding model on the basis of a shape formed with the side surface, the first bonding surface, and the second bonding surface.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A to 2D are diagrams illustrating exemplary structures of data stored in a board model storage unit according to an embodiment of the present invention;

FIGS. 6A to 6F are diagrams illustrating an example of generating a bonding model of chip component bonding type according to an embodiment of the present invention;

FIGS. 7A to 7C are diagrams illustrating an example of generating a top surface of an electrode of QFP bonding type according to an embodiment of the present invention;

FIGS. 8A to 8D illustrate examples of a three-dimensional model of a circuit board and shapes of bonding parts.

DESCRIPTION OF EMBODIMENTS

The precision of a result of the above-mentioned traditional structural analysis is low, and it becomes a problem when an analysis with high precision is required. Therefore, it is preferable to provide a bonding model generation technology capable of generating a high-precision bonding model having a shape close to an actual bonding shape.

The embodiments provide a bonding model generation technology capable of generating a high-precision bonding model used in a structural analysis simulation of a circuit board.

Embodiments of the present invention will be discussed with reference to FIGS. 1 to 8.

Figure 1:
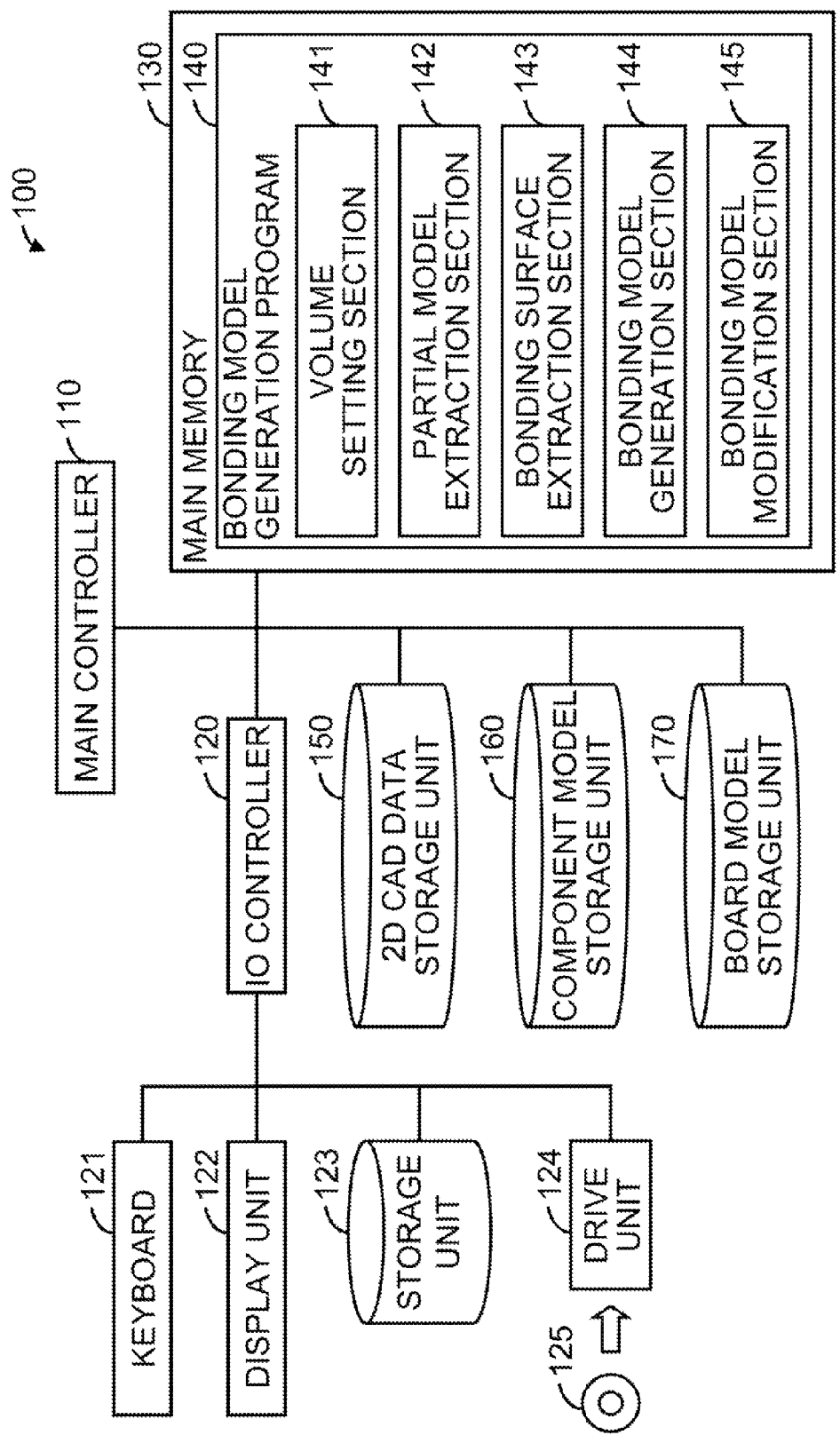
FIG. 1 is a diagram illustrating an exemplary configuration of a bonding model generation apparatus according to an embodiment of the present invention.

FIG. 1 illustrates an exemplary configuration of a bonding model generation apparatus 100 according to an embodiment of the present invention. FIG. 1 illustrates a part related to the present embodiment. The bonding model generation apparatus 100 includes a main controller 110, a keyboard 121, a display unit 122, a storage unit 123, a drive unit 124, an input output (IO) controller 120, a main memory 130, a two-dimensional (2D) CAD data storage unit 150, a component model storage unit 160, and a board model storage unit 170.

The main controller 110 executes a program and controls data. The keyboard 121 is an input device used by an operator to input data of an instruction to start the program and/or data of an answer to a process performed by the bonding model generation apparatus 100. The display unit 122 displays, for example, a two-dimensional and/or three-dimensional assembled board. The storage unit 123 stores programs and data to be loaded into the main memory 130. The drive unit 124 reads data out of and writes data into a non-transitory recording medium 125 such as a floppy (a registered trade mark) disk, a compact disk (CD), a compact disk read only memory (CD-ROM), a digital versatile disk (DVD). The IO controller 120 controls the keyboard 121, the display unit 122, the storage unit 123, and the drive unit 124. The main memory 130 stores an expanded bonding model generation program 140. The 2D CAD data storage unit 150 stores CAD data generated through the packaging design. The component model storage unit 160 stores, for example, information about the three-dimensional shapes of components mounted on the circuit board.

The board model storage unit 170 stores the three-dimensional model data of an assembled board. The three-dimensional model data is generated on the basis of data stored in the 2D CAD data storage unit 150 and data stored in the component model storage unit 160. The 2D CAD data storage unit 150 also stores mask data for printing the bonding material, i.e., the solder paste.

The bonding model generation program 140 includes a volume setting section 141, a partial model extraction section 142, a bonding surface extraction section 143, a bonding model generation section 144, and a bonding model modification section 145. Next, functions implemented by the main controller 110 by executing the bonding model generation program 140 will be discussed.

The volume setting section 141 causes the main controller 110 to obtain data of the volume of the bonding material printed on each of pads of the circuit board from the mask data for printing the bonding material designed on the basis of data of the area of each of the pads, which is included in the 2D CAD data storage unit 150, and the thickness of the bonding material provided on each of the pads, and store the data of the volume in the board model storage unit 170.

The partial model extraction section 142 causes the main controller 110 to extract a partial model of a pad targeted for the bonding model generation and a partial model of an electrode of a mounted component connected to the above-mentioned pad from the board model storage unit 170 storing a model of an assembled board which is a circuit board with components mounted thereon.

The bonding surface extraction section 143 causes the main controller 110 to determine bonding surfaces, i.e., a top surface and a bottom surface of the bonding model, on the basis of the partial model of the pad and the partial model of the electrode with reference to bonding information indicating one of plural types of bonding between the circuit board and the component. The bonding model generation section 144 causes the main controller 110 to generate a side surface on the basis of the determined bonding surfaces and generate the bonding model.

The bonding model modification section 145 causes the main controller 110 to modify the shape of the generated bonding model on the basis of the data of the volume of the bonding material stored in the board model storage unit 170.

Next, exemplary data stored in the board model storage unit 170 will be discussed. The data of an assembled board model stored in the board model storage unit 170 is generated on the basis of the CAD data of the circuit board stored in the 2D CAD data storage unit 150, and the component model data stored in the component model storage unit 160 by executing a conversion program (not illustrated). More specifically, the data of the assembled board model is generated by converting two-dimensional CAD data generated through a packaging design CAD into a three-dimensional CAD data, combining component model data which is three-dimensional shape data with the three-dimensional CAD data of the circuit board obtained through the conversion. That is, the assembled board model includes partial models of pads, wiring, via holes, insulation layers, etc. constituting the circuit board and partial models of a body, electrode units, ends, etc. constituting each of mounted components. The partial model includes data of the shape and information about the attribute of each of the above-mentioned elements.

Each of FIGS. 2A to 2D illustrates an exemplary structure of data stored in the board model storage unit 170 according to the present embodiment. The data of the assembled board model includes the partial model of each of the elements including the pads, the wiring, etc. constituting the circuit board and the partial model of each of the elements including the body, the electrode units, etc. constituting each of the mounted components. The exemplary data illustrated in each of FIGS. 2A to 2D denotes data discussed in the present embodiment.

FIG. 2A illustrates exemplary data of the partial model of the circuit board. A record of the partial model data of the circuit board includes a "board partial model ID" field 2010, a "class" field 2020, a "layer" field 2030, "attribute data address" field 2040, and a "shape data" field 2050. The "board partial model ID" field 2010 stores an identifier (ID) used to identify a partial model. The "class" field 2020 stores data indicating a class of the element. The classes include the pads, the wiring, the via holes, etc. The "layer" field 2030 stores data indicating a layer of the circuit board, in which the element is provided. The "attribute data address" field 2040 stores data indicating an address of the data area where the attribute data is stored. The "shape data" field 2050 stores three-dimensional data of the shape of the element.

FIG. 2B illustrates exemplary attribute data of the partial model of the circuit board. FIG. 2B illustrates exemplary attribute data of the partial model having "pad" in the "class" field 2020. A record of the attribute data of the partial model having "pad" in the "class" field 2020 includes a "component ID" field 2110, a "pin No." field 2120, and a "bonding material volume" field 2130. The fields of the record of attribute data vary with classes of the elements.

For example, a partial model having an ID "001" is data of the "pad" and is provided in a layer "1" of the circuit board. The attribute data of the partial model is stored in a data area starting from a data address "#128E". The three-dimensional shape data of the partial model indicates "xxx, xxx . . . " (the shape data is represented by a location determined with reference to the origin point of the circuit board, and indicates the shape and the location of the pad). According to the attribute data of the partial model, the partial model of the pad is bonded to the pin corresponding to a pin number "1" of a mounted component having an ID "cmp01". Since the volume of a bonding material is determined on the basis of execution of the bonding model generation program 140, the "bonding material volume" field 2130 is left blank.

FIG. 2C illustrates exemplary data of the partial model of the mounted component. A record of the partial model data of the mounted component includes a "component partial model ID" field 2210, a "component name" field 2220, a "pin" field 2230, a "location" field 2240, an "angle" field 2250, a "layer" field 2260, a "bonding type" field 2270, and a "shape model ID" field 2280. The "component partial model ID" field 2210 stores an identifier capable of identifying the partial model. The "component name" field 2220 stores data indicating a component name illustrated in a circuit diagram. The "pin" field 2230 stores information about pins included in the mounted component. The "location" field 2240, the "angle" field 2250, and the "layer" field 2260 store information about the arrangement of the mounted component on the circuit board. The "bonding type" field 2270 stores data indicating the type of bonding the mounted component to the pad. The "shape model ID" field 2280 stores an identifier capable of identifying the shape of the mounted component.

FIG. 2D illustrates exemplary data of the shape model. A record of the shape model data includes a "shape model ID" field 2310 and data fields provided for each of partial models. The "shape model ID" field 2310 stores the identifier capable of identifying the shape model. The data fields that are provided for each of the partial models include an "ID" field 2321, a "class" field 2322, a "relative location" field 2323, and a "shape data" field 2324. The "ID" field 2321 stores an identifier capable of identifying the partial model. The "class" field 2322 stores data indicating a class of an element. The "relative location" field 2323 stores data indicating a relative location of the partial model. The "shape data" field 2324 stores three-dimensional data of the shape of the element.

For example, a partial model having an ID "cmp01" has a component name "IC01", pins "1, 2, . . . " and is arranged on the circuit board at a location "xx, yy, zz" determined with reference to the origin point of the circuit board. The partial model is arranged in a layer "1" of the circuit board at an angle "1" (an angle is indicated every 90° angle from 0° angle to 270° angle, that is, angles 1 to 4 are indicated). The bonding type of the mounted component and the pad is "1" (the bonding type is "1" when the top surface of the pad and the bottom surface of the electrode are covered with a bonding material and bonded to each other as is the case of a BGA, the bonding type is "2" when not only the bottom surface of the electrode but also the side surface of the electrode is covered with the bonding material as is the case with a chip component, and the bonding type is "3" when a lead terminal is used as is the case with a QFP). The ID of the shape model of the mounted component is "bm01". The shape model includes n partial models "bm01-1" to "bm01-n". The n partial models include a "body", a "pin$_1$ (electrode unit$_1$)", and so forth. Each partial model data includes information about a relative location indicating a location of the partial model determined with reference to the reference location of the mounted component and data of the shape of the partial model.

The bonding model generation program 140 provided to generate a bonding model will be discussed. Here, an example where the pad of the circuit board is bonded to the electrode of the mounted component with solder paste and a bonding shape formed through soldering is generated as the bonding model will be discussed.

Figure 3:
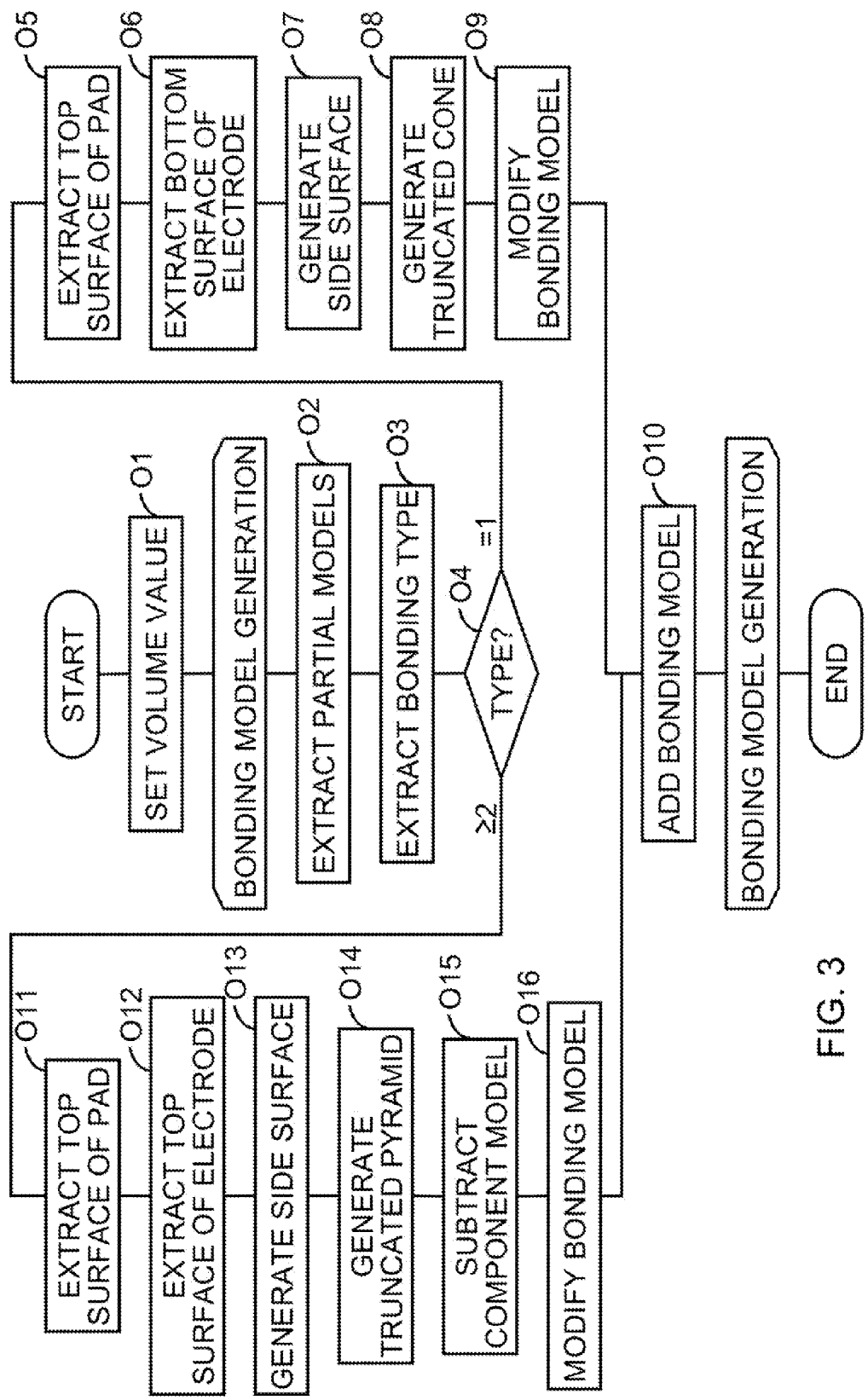
FIG. 3 is a diagram illustrating an exemplary operation flow described in a bonding model generation program according to an embodiment of the present invention.

FIG. 3 illustrates an exemplary operation flow described in the bonding model generation program 140 according to the present embodiment.

In operation O1, the main controller 110 calculates, by executing the volume setting section 141, the amount (volume) of solder paste provided on each pad on the basis of the mask data for printing the bonding material stored in the 2D CAD data storage unit 150 and set the value of the solder-paste amount to the "bonding material volume" field 2130 of the record of the attribute data of the corresponding pad stored in the board model storage unit 170. If there are a few hundred pads, the "bonding material volume" field 2130 is set for each of the pads.

In operation O2, the main controller 110 extracts, by executing the partial model extraction section 142, the partial model of a pad and the partial model of an electrode of the mounted component which is to be bonded to the pad from the data of the assembled board model stored in the board model storage unit 170. That is, the shape data of the partial model having the "class" field 2020 indicating "pad" is extracted from the partial model data of the circuit board illustrated in FIG. 2A, and data of the mounted component bearing the highest resemblance to the shape data is extracted referring to the information stored in the "location" field 2240 of the mounted component illustrated in FIG. 2C. Further, the partial model of an electrode (the "class" field 2322 of which stores "pin₁" to "pinₙ") provided at a location near that indicated by the shape data of the pad is extracted from among extracted data of the partial model₁ to the partial modelₙ of the mounted component. More specifically, the partial model of the electrode is extracted on the basis of information stored in the "location" field 2240, the "angle" field 2250, the "class" field 2322, the "relative location" field 2323, and the "shape data" field 2324 of the mounted component.

In operation O3, the main controller 110 extracts, by executing the bonding surface extraction section 143, the bonding information of the mounted component extracted through operation O2. That is, the main controller 110 extracts the information stored in the "bonding type" field 2270 illustrated in FIG. 2C.

In operation O4, the main controller 110 checks to which of the BGA bonding type "1", the chip component bonding type "2", and the QFP bonding type "3" the bonding information extracted through operation O3 corresponds.

In operation O5, when the bonding information corresponds to the bonding type "1", the top surface of the pad becomes the surface bonded through soldering. Therefore, the main controller 110 extracts data of the top surface from the "shape data" field 2050 of the extracted partial model of the pad as one piece of bonding surface data.

In operation O6, since the bottom surface of the electrode becomes the surface bonded through soldering, the main controller 110 extracts data of the bottom surface from the "shape data" field 2324 of the partial model of the electrode as another piece of the bonding surface data.

In operation O7, the main controller 110 generates, by executing the bonding model generation section 144, a surface establishing a link between the outlines of both of the bonding surfaces (corresponding to the top surface of the pad and the bottom surface of the electrode) as a side surface.

In operation O8, the main controller 110 determines a shape formed with the generated side surface, the top surface of the pad, and the bottom surface of the electrode to be the bonding model. When the bonding information indicates that the pad and the electrode are bonded in the BGA bonding type "1", the shape of each of the pad and the electrode is usually a circle (the three-dimensional shape is usually a circular cylinder). Therefore, the generated bonding model has the shape of a circular truncated cone.

In operation O9, the main controller 110 modifies, by executing the bonding model modification section 145, the shape of the bonding model on the basis of the set value of the "bonding material volume" field 2130, which is set in operation O1. When the shape of the circular truncated cone is modified, the curved side surface of the circular truncated cone is inflated or deflated. The details of the shape modification will be discussed later.

In operation O10, the main controller 110 adds data of the bonding model after the shape modification to the assembled board model, and stores data of the assembled board model in the board model storage unit 170.

Figure 4C:
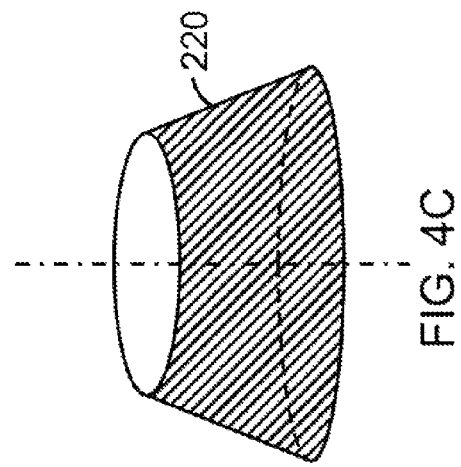
FIGS. 4A to 4D are diagrams illustrating an example of generating a bonding model of BGA bonding type according to an embodiment of the present invention.
Figure 4D:
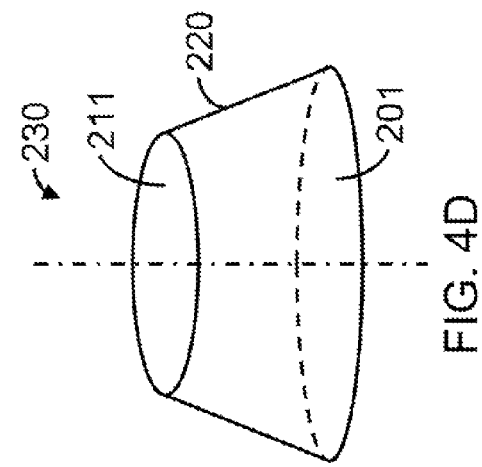
Figure 4A:
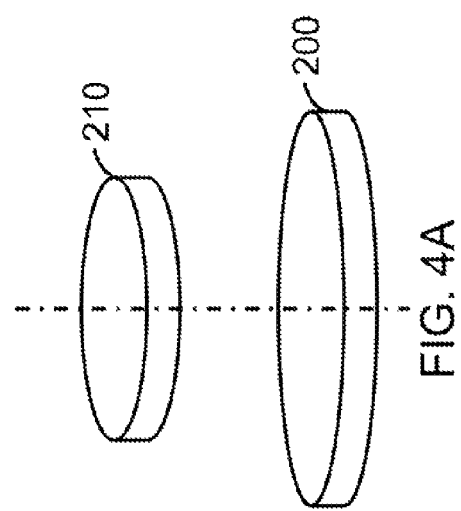
Figure 4B:
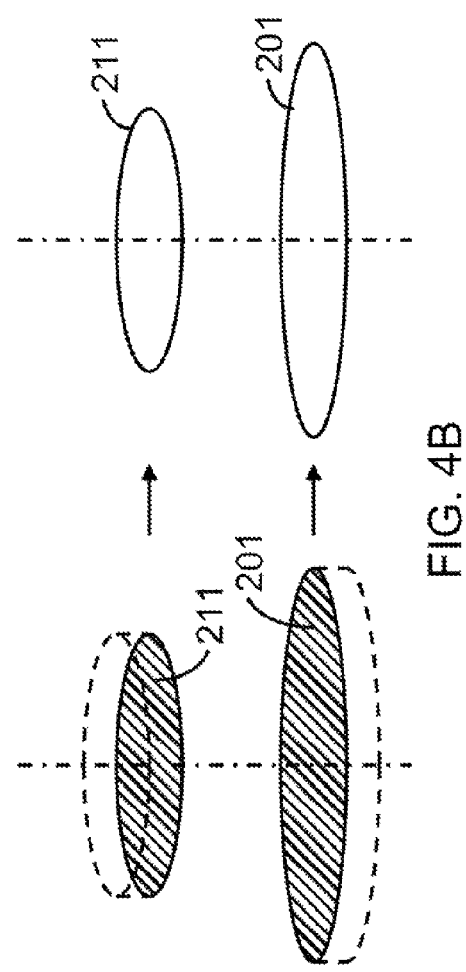

An example where a bonding model is generated for a mounted component of the BGA bonding type (the bonding type "1") according to the operation flow of operations O5 to O9 will be discussed with reference to FIGS. 4A to 4D. FIG. 4A illustrates a partial models of a pad 200 and an electrode 210 to be bonded each other, data of which is extracted from the assembled board model. As illustrated in FIG. 4A, each of the partial models of the pad 200 and the electrode 210 has the shape of a circular cylinder, and the partial models are vertically opposed to each other. FIG. 4B illustrates the state where a top surface 201 of the pad 200 and an bottom surface 211 of the electrode 210 are extracted as bonding surfaces that are covered with solder through solder bonding. FIG. 4C illustrates a curved side surface 220 establishing a link between the outlines of the top surface 201 of the pad 200 and the bottom surface 211 of the electrode 210 (in other words, the curved side surface is formed by making the outline of the pad 200 sweep to that of the electrode 210, and vice versa). A shape formed with the generated curved side surface 220, the top surface 201 of the pad 200, and the bottom surface 211 of the electrode 210 is determined to be a bonding model 230 illustrated in FIG. 4D. Since the mounted component is of the BGA bonding type as discussed above, each of the top surface 201 and the bottom surface 211 has the shape of a circle and the generated bonding model 230 has the shape of a circular truncated cone. Each of the pad 200 and the electrode 210 may have a different shape.

Next, an example of the modification of the shape of the bonding model in operation O10 will be discussed. Since the "bonding material volume" field 2130 is set in operation O1, the main controller 110 adjusts the volume of the bonding model to the value of the "bonding material volume" field 2130 set in operation O1.

Figure 5A:
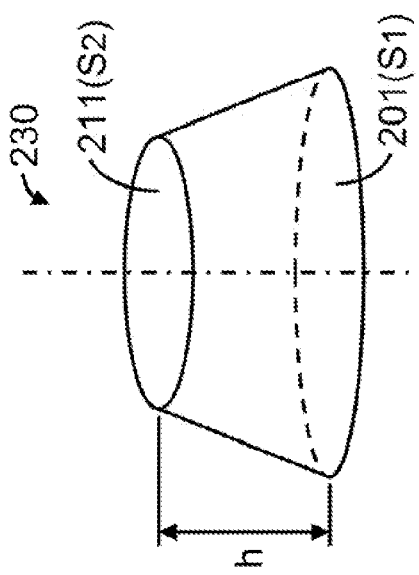
FIGS. 5A to 5C are diagrams illustrating an example of modification of a bonding model according to an embodiment of the present invention.
Figure 5C:
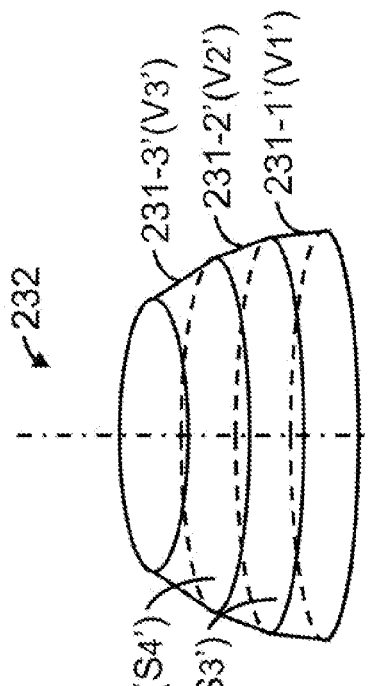
Figure 5B:
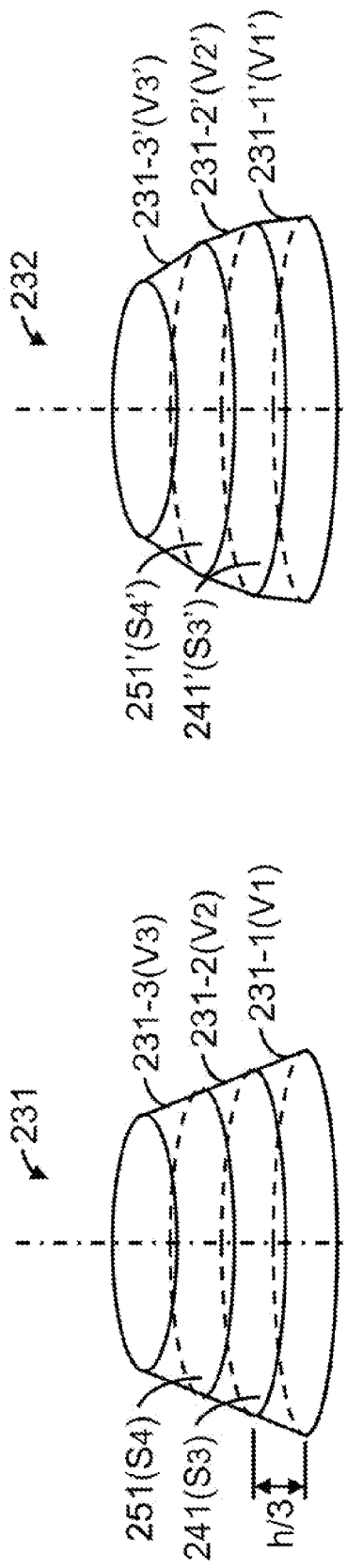

FIGS. 5A to 5C illustrate an example of modification of the bonding model according to the present embodiment. FIG. 5A illustrates the bonding model 230 having the shape of the circular truncated cone generated as illustrated in FIG. 4D. The main controller 110 cuts the circular truncated cone of the bonding model 230 horizontally at heights spaced at regular intervals and divides the circular truncated cone into at least two circular truncated cones. Then, the main controller 110 increases or decreases the radius of the cut surface so that the total amount of the volumes of the divided circular truncated cones becomes the value set to the "bonding material volume" field 2130.

A volume V of the bonding model 230 illustrated in FIG. 5A may be expressed as Equation (1).

$$V=(S_1+\sqrt{S_1}\cdot\sqrt{S_2}+S_2)\cdot h/3 \qquad \text{Equation (1),}$$

where the signs $S_1$ and $S_2$ express the individual areas of the bottom surface and the top surface of the bonding model 230, and the sign h expresses the height of the bonding model 230.

In the present embodiment, the bonding model 230 is divided into three parts. FIG. 5B illustrates a divided bonding model 231 including circular truncated cones 231-1 to 231-3. The height of each of the circular truncated cones 231-1 to 231-3 is h/3 and each of the volumes $V_1$ to $V_3$ of the individual circular truncated cones 231-1 to 231-3 may be calculated in a similar way to Equation (1), as follows:

$$V_1=(S_1+\sqrt{S_1}\cdot\sqrt{S_3}+S_3)\cdot h/9 \qquad \text{Equation (2),}$$

$$V_2=(S_3+\sqrt{S_3}\cdot\sqrt{S_4}+S_4)\cdot h/9 \qquad \text{Equation (3), and}$$

$$V_3=(S_4+\sqrt{S_4}\cdot\sqrt{S_2}+S_2)\cdot h/9 \qquad \text{Equation (4),}$$

where the sign $S_3$ expresses the area of a top surface 241 of the circular truncated cone 231-1. The top surface 241 is also the bottom surface of the circular truncated cone 231-2. Further, the sign $S_4$ expresses the area of a top surface 251 of the circular truncated cone 231-2. The top surface 251 is also the bottom surface of the circular truncated cone 231-3.

The volume V of the bonding model 231 becomes the total amount of the volumes of the circular truncated cones 231-1 to 231-3. That is, the following equation is provided:

$$V=V_1+V_2+V_3 \qquad \text{Equation (5).}$$

The value of each of the volumes $V_1$ to $V_3$ is increased or decreased by increasing or decreasing the value of each of the areas $S_3$ and $S_4$ illustrated in FIG. 5B so as to make the value of volume V in Equation (5) equal to the value set to the "bonding material volume" field 2130 (each of the areas $S_3$ and $S_4$ is increased when the volume V of the bonding model is smaller than the value set to the "bonding material volume" field 2130 and is decreased when the volume V is larger than the set value). More specifically, when the radii of the top surfaces 241 and 251 are referred to as $r_3$ and $r_4$, respectively, the radii $r_3$ and $r_4$ are slightly increased or decreased all together by as much as equivalent amounts so that the area $S_3$ ($S_3 = \pi r_3^2$) and the area $S_4$ ($S_4 = \pi r_4^2$) are increased or decreased. Each time the increase or the decrease is performed, the values of the volumes $V_1$ to $V_3$ in Equations (2) to (4) are calculated. When the value of the volume V in Equation (5) becomes the same as that set to the "bonding material volume" field 2130 (or when the difference between the value of the volume V in Equation (5) and that set to the "bonding material volume" field 2130 falls within a specified range of permissible values), the bonding model is modified on the basis of the radii $r_3$ and $r_4$. FIG. 5C illustrates the shape of a modified bonding model 232. The main controller 110 obtains a top surface 241' by modifying the top surface 241 by increasing the area $S_3$ to an area $S_3'$ and obtains a top surface 251' by modifying the top surface 251 by increasing the area $S_4$ to an area $S_4'$. The volume V' ($V' = V_1' + V_2' + V_3'$), which is the total amount of the volumes of the three circular truncated cones 231-1' to 231-3', is equivalent to the value set to the "bonding material volume" field 2130. The shape of the bonding model 232 is that of the bonding model 230 which is yet to be modified but has an inflated curved side surface. On the contrary, when the value of each of the areas $S_3$ and $S_4$ is decreased, the curved side surface of the bonding model 230 is deflated.

Returning to the operation flow illustrated in FIG. 3, when it is revealed that the bonding type is "2" (the chip component bonding type) or "3" (the QFP bonding type) in operation O4, the operation flow is shifted to operation O11.

In operation O11, the main controller 110 extracts data of a top surface from the "shape data" field 2050 of the extracted partial model of the pad, as one piece of bonding surface data.

In operation O12, the main controller 110 extracts data of a top surface from the "shape data" field 2050 of the partial model of the electrode, as another piece of the bonding surface data.

In operation O13, usually, the shape of each of a pad and an electrode that are of the chip component bonding type and the QFP bonding type is a quadrangle (the three-dimensional shape is usually a quadrangular prism). Therefore, the main controller 110 generates, by executing the bonding model generation section 144, surfaces establishing links between the corresponding sides of the outlines of both of the extracted top surfaces, as side surfaces.

In operation O14, the main controller 110 generates a quadrangular truncated pyramid with both of the top surfaces of the pad and the electrode, and the generated side surfaces.

In operation O15, the main controller 110 subtracts the partial model of the mounted component from the generated quadrangular truncated pyramid through Boolean operation, and determines a shape left after the subtraction to be the bonding model. Since the shape of the bonding model is modified in operation O16, the bonding model obtained through operation O15 is a bonding model yet to be subjected to the shape modification.

Operation O16 will be discussed later.

Figure 6B:
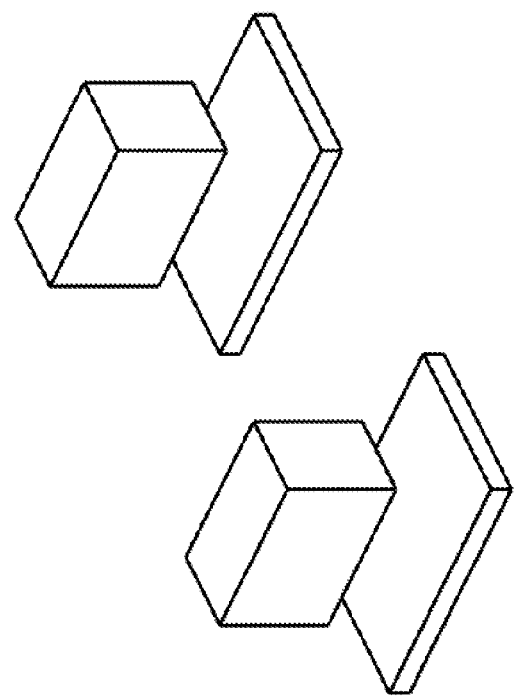
Figure 6A:
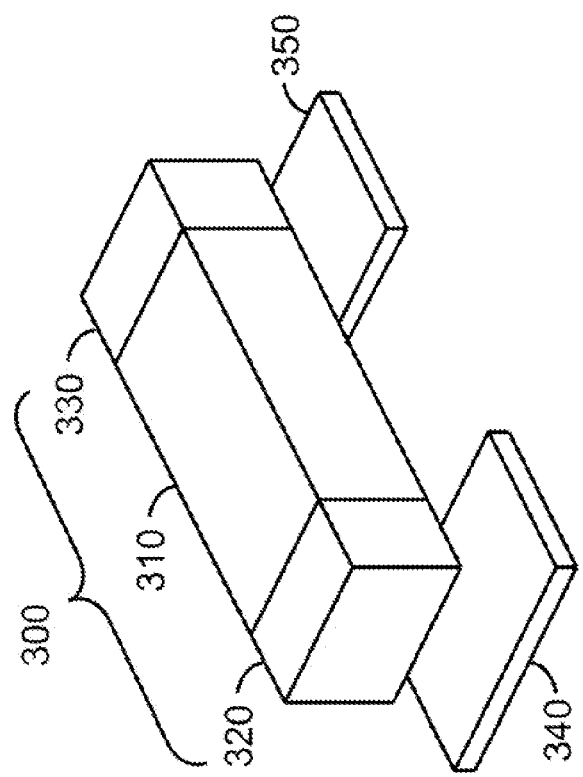
Figure 8C:
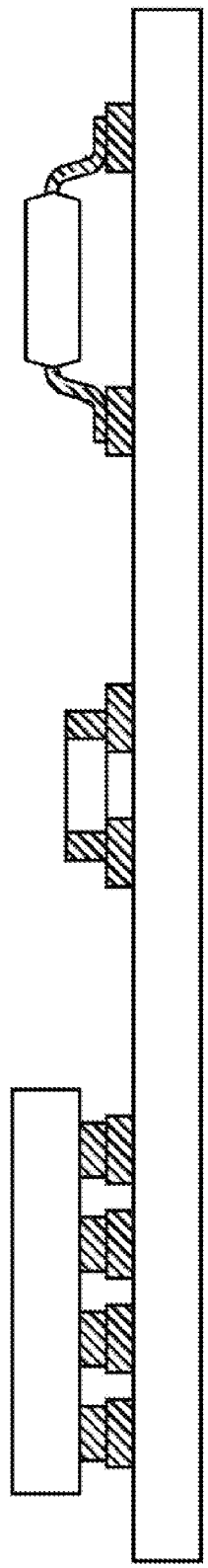
Figure 8D:
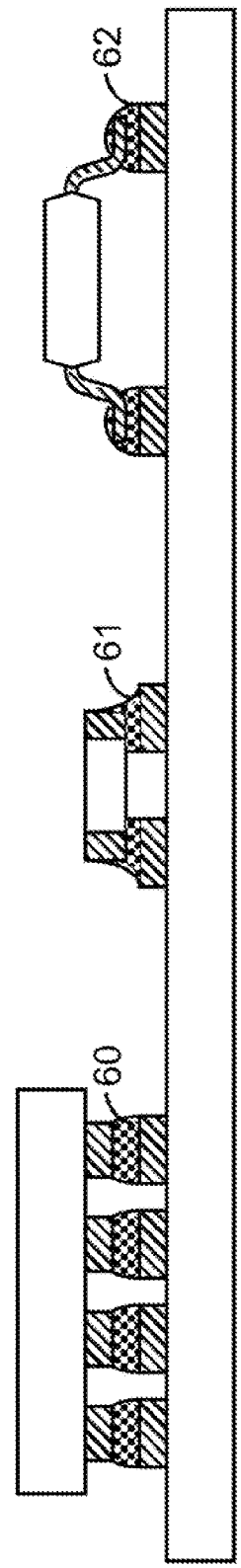

An example where a bonding model is generated for a mounted component of the chip component bonding type (the bonding type "2") according to the operation flow of operations O11 to O15 will be discussed with reference to FIGS. 6A to 6F. FIG. 6A illustrates partial models of a mounted component 300 and pads 340 and 350 on the basis of the shape data illustrated in each of FIGS. 2A and 2D. The mounted component 300 includes partial models of a body 310, and electrode units 320 and 330. FIG. 6B illustrates the partial models of the pads and the electrodes, which are extracted from FIG. 6A. On the left side of FIG. 6C, the top surfaces of the pads 340 and 350 and those of the electrodes 320 and 330 are shaded as bonding surfaces. On the right side of FIG. 6C, only the bonding surfaces (top surfaces 341 and 351 of the pads, and top surfaces 321 and 331 of the electrodes) are extracted. A bonding model is generated on the basis of a set of a pad and an electrode that are bonded to each other, and FIG. 6C illustrates two bonding models to be generated on the basis of two sets of the pad and the electrode.

FIG. 6D illustrates side surfaces 360 establishing links between the sides of the top surface 341 of the pad 340 and that of the top surface 321 of the electrode 320, and side surfaces 361 establishing links between the sides of the top surface 351 of the pad 350 and that of the top surface 331 of the electrode 330.

On the left side of FIG. 6E illustrates a quadrangular truncated pyramid 370 formed with the top surface 341 of the pad 340, the top surface 321 of the electrode 320, and the side surfaces 360, and a quadrangular truncated pyramid 371 formed with the top surface 351 of the pad 350, the top surface 331 of the electrode 330, and the side surfaces 361. The right side of FIG. 6E illustrates the state where the partial model of the mounted component 300 of the chip component bonding type is subtracted from the quadrangular truncated pyramids 370 and 371 through Boolean operation (Boolean operation denotes Boolean set operation for the sum, the difference, and the product of shapes having volumes).

FIG. 6F illustrates the shapes of bonding models 380 and 381 resulted from the subtraction. As illustrated in FIGS. 6A to 6F, the shape of the bonding model of chip component bonding type includes the shape of solder formed on the side surface of the electrode in addition to that formed on each of the top surface of the pad and the bottom surface of the electrode. That is, the shape of the bonding model is similar to a shape attained through actual solder bonding.

The discussion returns to the operation flow illustrated in FIG. 3.

In operation O16, the main controller 110 modifies, by executing the bonding model modification section 145, the shape of the bonding model obtained through Boolean operation, so that the volume of the shape agrees with the value set to the "bonding material volume" field 2130. The method of modification is similar to that illustrated in operation O9. That is, the main controller 110 cuts the quadrangular truncated pyramid yet to be subjected to Boolean operation horizontally at heights spaced at regular intervals and divides the quadrangular truncated pyramid into at least two quadrangular truncated pyramids. Then, the main controller 110 increases or decreases areas of the cut surfaces, and generates modified quadrangular truncated pyramids with surfaces having the increased or decreased areas. The main controller 110 performs control so that the volume of a shape left after subtracting the partial model of the chip component from a shape obtained by combining the modified quadrangular truncated pyramids with each other through Boolean operation becomes equivalent to the set volume of the bonding material.

The volume of the quadrangular truncated pyramid may also be obtained through Equation (1), and the area may be slightly increased or decreased while maintaining the original ratio of lengths of the sides of the cut surface. After increasing or decreasing the area of each of the cut surfaces, the main controller 110 combines the modified quadrangular truncated pyramids into a single quadrangular truncated pyramid, performs Boolean operation, that is, subtracts the partial model of the chip-component from the shape of the single quadrangular truncated pyramid, and compares the value of the volume of the shape left after the subtraction to the value set to the "bonding material volume" field 2130. The main controller 110 performs the above-discussed operations repeatedly and modifies the shape of the bonding model.

In a case of a mounted component of the QFP bonding type "3", it may be considered a part of the lead terminal constitutes an electrode part in contrast to the case of the mounted component of the chip component bonding type. A method of generating the bonding model in that case will be discussed with reference to FIGS. 7A to 7C. FIG. 7A illustrates shapes of a pad 400 and a lead terminal 410. In that state illustrated in FIG. 7A, the main controller 110 generates a surface by horizontally extending an upper surface of the lead terminal 410, the upper surface being parallel to the pad 400, toward a bent part of the lead terminal 410 as illustrated in FIG. 7B, as a top surface 411 of an electrode as illustrated in FIG. 7C. The main controller 110 generates a quadrangular truncated pyramid between the top surface 411 of the electrode and a top surface 401 of the pad 400 by using the method discussed for the chip component bonding type. Operations performed after generating the quadrangular truncated pyramid is similar to that performed in the case of the chip component.

After generating a bonding model for one pad, the main controller 110 extracts the partial model of another pad from the assembled board model, performs similar operations, and generates another bonding model. After generating a bonding model for each of the pads, the main controller 110 terminates the execution of the bonding model generation program.

After terminating the execution of the bonding model generation program, the main controller 110 performs a structural analysis simulation on the basis of an assembled board model including the generated bonding model.

In the present embodiment, data of the electrode of the mounted component bonded to the pad is extracted on the basis of the location information of each of the pad and the electrode. However, the electrode data may be obtained from the attribute data of the pad, which is illustrated in FIG. 2B, for extraction.

Thus, the shape of a bonding model is automatically generated on the basis of the shape and the location of an actual mounted component, and those of the pad of a circuit board. Consequently, the shape of the generated bonding model becomes close to that of the actual bonding material, which increases the analysis precision.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been discussed in detail, it should be understood that the various changes, substitutions, and alterations could be made hereto without departing from the spirit and scope of the invention.

What is claimed is:

1. A bonding model generation apparatus, comprising:

a memory;

a processor coupled to the memory and configured to:

store data of a board model of an assembled board, the assembled board including a circuit board and a component to be mounted on the circuit board, the data of the board model including data of partial models and bonding information, the partial models including a model of a part of the circuit board and a model of a part of the component, the bonding information indicating one of plural bonding types of bonding between the circuit board and the component;

extract data of a first partial model and data of a second partial model from the data of the board model, the first partial model being a model of a pad included in the circuit board, the second partial model being a model of an electrode included in the component, the electrode being to be bonded to the pad with a bonding material;

determine whether the bonding information indicates a first bonding type in which a top surface of the first partial model is bonded only to a bottom surface of the second partial model or a second bonding type in which the top surface of the first partial model is bonded to the bottom surface and another surface of the second partial model;

extract, based on whether the bonding information indicates the first bonding type or the second bonding type, data of a first bonding surface corresponding to a bottom surface of a bonding model from the data of the first partial model and data of a second bonding surface corresponding to a top surface of the bonding model from the data of the second partial model; and generate a side surface establishing a link between outlines of the first bonding surface and the second bonding surface, and obtain data of the bonding model on the basis of a shape formed with the side surface, the first bonding surface, and the second bonding surface.

2. The bonding model generation apparatus according to claim 1, wherein when the bonding information indicates the first bonding type, the processor extracts, data of the top surface of the first partial model as the data of the first bonding surface and data of the bottom surface of the second partial model as the data of the second bonding surface.

3. The bonding model generation apparatus according to claim 1, wherein when the bonding information indicates the second bonding type, the processor extracts, data of the top surface of the first partial model as the data of the first bonding surface and data of a top surface of the second partial model as the data of the second bonding surface, and the processor further modifies the shape by subtracting a model of the component through Boolean operation, and obtains the data of the bonding model on the basis of the modified shape.

4. The bonding model generation apparatus according to claim 1, wherein the data of the first partial model or the data of the second partial model includes data of a volume of the bonding material, and the processor further modifies a shape of the bonding model such that a volume of the bonding model becomes the volume of the bonding material.

5. The bonding model generation apparatus according to claim 4, wherein
the data of the board model is generated on the basis of two dimensional computer aided design (CAD) information resulted from packaging design of the assembled board, and
the data of the volume of the bonding material is generated on the basis of data of an area of the pad and data of a thickness of the bonding material on the pad, the data of the area and the data of the thickness being included in the two dimensional CAD information.

6. A bonding model generation method executed by a bonding model generation apparatus, the bonding model generation method comprising:
extracting data of a first partial model and data of a second partial model from data of a board model of an assembled board, the assembled board including a circuit board and a component to be mounted on the circuit board, the data of the board model including data of partial models and bonding information, the data of the board model being stored in a board model storage, the partial models including a model of a part of the circuit board and a model of a part of the component, the bonding information indicating one of plural bonding types of bonding between the circuit board and the component, the first partial model being a model of a pad included in the circuit board, the second partial model being a model of an electrode included in the component, the electrode being to be bonded to the pad with a bonding material;
determining whether the bonding information indicates
a first bonding type in which a top surface of the first partial model is bonded only to a bottom surface of the second partial model or
a second bonding type in which the top surface of the first partial model is bonded to the bottom surface and another surface of the second partial model;
extracting by the bonding model generation apparatus, based on whether the bonding information indicates the first bonding type or the second bonding type, data of a first bonding surface corresponding to a bottom surface of a bonding model from the data of the first partial model and data of a second bonding surface corresponding to a top surface of the bonding model from the data of the second partial model;
generating a side surface establishing a link between outlines of the first bonding surface and the second bonding surface; and
obtaining data of the bonding model on the basis of a shape formed with the side surface, the first bonding surface, and the second bonding surface.

7. The bonding model generation method according to claim 6, wherein
when the bonding information indicates the first bonding type, the bonding model generation apparatus extracts, data of the top surface of the first partial model as the data of the first bonding surface and data of the bottom surface of the second partial model as the data of the second bonding surface.

8. The bonding model generation method according to claim 6, wherein
when the bonding information indicates the second bonding type, the bonding model generation apparatus extracts, data of the top surface of the first partial model as the data of the first bonding surface and data of a top surface of the second partial model as the data of the second bonding surface, and the bonding model generation apparatus further modifies the shape by subtracting a model of the component through Boolean operation, and obtains the data of the bonding model on the basis of the modified shape.

9. A non-transitory computer readable recording medium storing a program causing a computer to execute a bonding model generation method, the bonding model generation method comprising:
extracting data of a first partial model and data of a second partial model from data of a board model of an assembled board, the assembled board including a circuit board and a component to be mounted on the circuit board, the data of the board model including data of partial models and bonding information, the data of the board model being stored in a board model storage, the partial models including a model of a part of the circuit board and a model of a part of the component, the bonding information indicating one of plural bonding types of bonding between the circuit board and the component, the first partial model being a model of a pad included in the circuit board, the second partial model being a model of an electrode included in the component, the electrode being to be bonded to the pad with a bonding material;
determining whether the bonding information indicates
a first bonding type in which a top surface of the first partial model is bonded only to a bottom surface of the second partial model or
a second bonding type in which the top surface of the first partial model is bonded to the bottom surface and another surface of the second partial model;
extracting, based on whether the bonding information indicates the first bonding type or the second bonding type, data of a first bonding surface corresponding to a bottom surface of a bonding model from the data of the first partial model and data of a second bonding surface corresponding to a top surface of the bonding model from the data of the second partial model;
generating a side surface establishing a link between outlines of the first bonding surface and the second bonding surface; and
obtaining data of the bonding model on the basis of a shape formed with the side surface, the first bonding surface, and the second bonding surface.

10. The non-transitory computer readable recording medium according to claim 9, wherein
when the bonding information indicates the first bonding type, the computer extracts, data of the top surface of the first partial model as the data of the first bonding surface and data of the bottom surface of the second partial model as the data of the second bonding surface.

11. The non-transitory computer readable recording medium according to claim 9, wherein
when the bonding information indicates the second bonding type, the computer extracts, data of the top surface of the first partial model as the data of the first bonding surface and data of a top surface of the second partial model as the data of the second bonding surface, and the computer further modifies the shape by subtracting a model of the component through Boolean operation, and obtains the data of the bonding model on the basis of the modified shape.

* * * * *